310-369 SR
2/16/88 XR 4,725,003

United States Patent [19]

Lange

[11] Patent Number: 4,725,003

[45] Date of Patent: Feb. 16, 1988

[54] ELECTRICALLY ACTUATABLE FUEL-INJECTION VALVE FOR INTERNAL COMBUSTION ENGINES

[75] Inventor: Jürgen Lange, Eschborn, Fed. Rep. of Germany

[73] Assignee: VDO Adolf Schindling AG, Frankfurt am Main, Fed. Rep. of Germany

[21] Appl. No.: 861,484

[22] Filed: May 9, 1986

[30] Foreign Application Priority Data

May 13, 1985 [DE] Fed. Rep. of Germany ....... 3517242

[51] Int. Cl.[4] ......................... B05B 3/14; H01L 41/04

[52] U.S. Cl. ......................... 239/102.2; 261/DIG. 48; 310/340; 310/369

[58] Field of Search ..................... 239/102.2; 310/340, 310/367, 369; 261/DIG. 48

[56] References Cited

U.S. PATENT DOCUMENTS

| | | | |
|---|---|---|---|
| 2,907,648 | 10/1959 | Chapman | 261/DIG. 48 X |
| 2,908,443 | 10/1959 | Fruengel | 261/DIG. 48 X |
| 4,372,491 | 2/1983 | Fishgal | 239/102.2 |

*Primary Examiner*—Andres Kashnikow
*Assistant Examiner*—Patrick N. Burkhart
*Attorney, Agent, or Firm*—Martin A. Farber

[57] ABSTRACT

An electrically actuatable fuel-injection valve for internal combustion engines has a piezoelectric vibrator (1) provided with electrodes (2, 3). A fuel-receiving chamber (4) in the vibrator is in fuel-conducting communication with a fuel feed path (constriction 5) and an ejection opening (outlet opening). The fuel feed path as well as the ejection opening are so shaped that upon the application of a voltage to the electrodes (2, 3) the fuel is imparted a preferred movement (8) through the chamber to the ejection opening.

8 Claims, 3 Drawing Figures

ELECTRICALLY ACTUATABLE FUEL-INJECTION VALVE FOR INTERNAL COMBUSTION ENGINES

FIELD AND BACKGROUND OF THE INVENTION

Related Applications

This application is related to co-pending application Ser. Nos. 06/861,482 and 06/861,483 both filed on May 9, 1986.

The invention refers to an electrically actuatable fuel-injection valve for internal combustion engines.

Such known fuel-injection valves are actuated by a solenoid whose magnet winding is arranged within a central bore in a valve housing (German Fed. Republic Pat. No. 23 49 584). A soft-iron core is inserted into the magnet winding, the core being developed outside the valve housing as a connection nipple for the feeding of the fuel. An armature is so arranged opposite the end of the soft-iron core that an air gas is formed between these two parts. A valve needle which is guided for longitudinal displacement in a tapered end of the valve housing is arranged on the armature. The valve needle is so developed, in particular with flat surfaces ground on its body, that fuel can flow into an annular space in front of a valve seat of the valve needle. When the solenoid is energized, the armature attracts the valve needle which thus opens the valve. Fuel under pressure is injected into the internal combustion engine through a metering slot which is then opened. The manufacture of such fuel-injection valves which have a longitudinally displaceable valve needle is expensive since the fuel-injection valve consists of many parts which must be manufactured, in part, with high precision and then mounted.

Furthermore, the longitudinally displaceable valve needles and their support are subject to wear, as a result of which the amount of feed can be modified. The actuating of this electromagnetic fuel-injection valve requires substantial electric power, for which suitably dimensioned components must be provided.

SUMMARY OF THE INVENTION

It is an object of the invention to create an electrically actuatable fuel-injection valve for internal combustion engines which has no moving valve elements which are to be displaceably mounted and which is characterized by a simple construction. The fuel-injection valve should not be subject to any substantial amount of wear and should be capable of being controlled with little electric power.

According to the invention, the fuel-injection valve has a piezoelectric vibrator (1; 11) which is provided with electrodes (2, 3; at 14, 15) and has at least one fuel-receiving chamber (4; 12, 12'), while a fuel feed path (constriction 5; constant-volume chamber 20) and an injection opening (bore 10) are in fuel-conducting communication with the chamber, said opening being so developed that when voltage is applied to the electrodes (2, 3; at 14, 15) the fuel is imparted a preferred movement (8; 17, 17') through the chamber to the injection opening.

The principle of the invention is that a piezoelectric component, which is referred to as piezoelectric vibrator, is so developed and arranged that the fuel-injection valve, without having any element which is movable as a whole and particularly without a longitudinally displaceable valve needle, determines the preferred direction of movement of the liquid fuel, namely the direction of injection, meters the amount of fuel and creates the condition for the atomization of the fuel. This result is obtained in the manner that the piezoelectric vibrator contracts or expands due to the electric field upon application of electric voltage to the electrodes of said vibrator, so that the volume of a fuel-receiving chamber varies and that, upon a reduction in the volume of the chamber, the fuel emerges essentially from the injection opening while the return flow of fuel through the fuel feed path is substantially throttled.

In one embodiment of the fuel-injection valve, the preferred direction of movement of the fuel is determined in the manner that the piezoelectric vibrator is developed as a thickness vibrator (1) and that the fuel-receiving chamber (4) passes through the member (vibrator) transverses to the direction of vibration (arrow 7) and is developed with a unilateral constriction (5) as fuel feed path. The fuel is ejected on the side opposite the constriction of the chamber.

For the determination of the quantity injected a diaphragm (9) having a bore (10) which is smaller than the diameter of the chamber can be arranged, in addition, as injection opening of the chamber on one side of the latter. Due to the fact that the relatively small bore is to be made in a separate diaphragm which consists of material which is easier to work than the piezoelectric vibrator, the manufacture as a whole can be simplified. For example, the bore in the diaphragm can have a very small diameter, which can be produced only with difficulty in a vibrator consisting of piezoelectric material. The chamber in the vibrator, on the other hand, has a larger diameter. In this way, a fine atomization of the injected fuel can also be obtained.

In another embodiment of the fuel valve, the piezoelectric vibrator is developed as a hollow, cylindrical, radial vibrator (11) within the wall of which a number of chambers (12, 12') are arranged parallel and concentric to the longitudinal axis (19) thereof.

The individual chamber volumes of the chambers arranged in the wall can be activated jointly, depending on their purpose of use, particularly the amount of fuel to be injected (an inner wall (at $r_1$) and an outer wall (at $r_2$) of the hollow cylindrical radial vibrator (11) being acted on by voltage substantially over their entire surface so that all chamber volumes are changed simultaneously and in the same direction), or else activated one after the other by application of a locally limited electrical field (optionally individual sections of an inner wall (at $r_1$) or an outer wall (at $r_2$) of the hollow cylindrical radial vibrator (11) being acted on by voltage so that the chamber volumes are activated individually, in particular one after the other). In the last-mentioned case, at least one electrode does not extend continuously over an outer wall or inner wall but is divided into surface segments corresponding to the chambers. The facing electrode can, on the other hand, extend as a continuous surface over the associated wall. The individually actuatable chambers in a hollow, cylindrical, radial vibrator can have volumes which differ from each other or be closed off on one side by an annular diaphragm having bores of different size so that, depending on which chamber is activated, the quantity of fuel fed can be varied. It is also possible to keep individual chambers in the radial vibrator switchably on reserve for the event that one or more of the other chambers fail.

In order to increase the quantitative flow of the fuel with simultaneous actuation of all chambers provided in the hollow cylindrical radial vibrator, several such hollow cylindrical radial vibrators having staggered outside diameters can furthermore be arranged concentrically one within the other. Despite higher quantitative flow the volume taken up by the entire vibrator thus need not be substantially increased.

The radial vibrator (11) can be provided on its ejection side with an annular diaphragm (16) which has reduced bores (17, 17') as compared with the chamber diameters.

The diaphragm, which by boreholes determines the droplet size of the fuel, is formed for the hollow cylindrical radial vibrator advisedly as annular diaphragm which has reduced boreholes as compared with the corresponding chamber diameters. This separate annular diaphragm can, in its turn, be manufactured more favorably than chambers of different and particularly very small diameter in the piezoelectric material of the radial vibrator.

Instead of a throttling constriction in the fuel feed path on one side of the chamber, there can be located there a so-called constant-volume chamber having a fuel feed opening and a fuel discharge opening, the area of which is small as compared with the area of the non-resilient constant-volume chamber wall. Upon changes in volume of the chambers in the piezoelectric vibrator, fuel flows back from the activated chambers into the constant-volume chambers only to a slight extent since the constant-volume chamber walls are substantially non-resilient and the fuel is non-compressible.

Piezoceramic material is preferably used as material for the manufacture of the vibrator.

The piezoelectric vibrators can be so manufactured therefrom that an extremely precise metering and atomization of the fuel over a long period of operation is obtained. In order to produce the electric field which effects the changes in wall thickness of the piezoelectric vibrator an electric voltage must be made available. Depending on the operating frequency, the piezoelectric vibrator can be of capacitive, inductive as well as ohmic character, which can have a favorable effect on the loss power which is transformed in the injection valve.

Each fuel-receiving chamber (12, 12') can be formed as a continuous bore of constant diameter in the vibrator (11) and a constant-volume chamber (20) having a fuel feed opening (fuel feed nipple 21) and a fuel discharge opening (fuel discharge nipple 22) can be arranged at one end of the bore, the area of which openings is small as compared with the area of the non-resilient constant-volume chamber wall.

Further according to the invention, the piezoelectric vibrator is mounted in a block (18) from which the fuel feed path is formed, said path being in communication with the fuel-receiving chamber(s).

Still further for the series of fuel-receiving chambers which pass through the radial vibrator parallel to its longitudinal axis and are arranged concentric to the longitudinal axis, a common annular constant-volume chamber (20), also concentric to the longitudinal axis, is formed from the block (18), into which chamber one end of the radial vibrator extends.

BRIEF DESCRIPTION OF THE DRAWINGS

With the above and other objects and advantages in view, the present invention will become more clearly understood in connection with the detailed description of preferred embodiments, when considered with the accompanying drawings, of which.

DETAILED DESCRIPTION OF THE PREFERRED EMBODIMENTS

In all figures the fuel-injection valve has been shown greatly enlarged.

Figure 1:
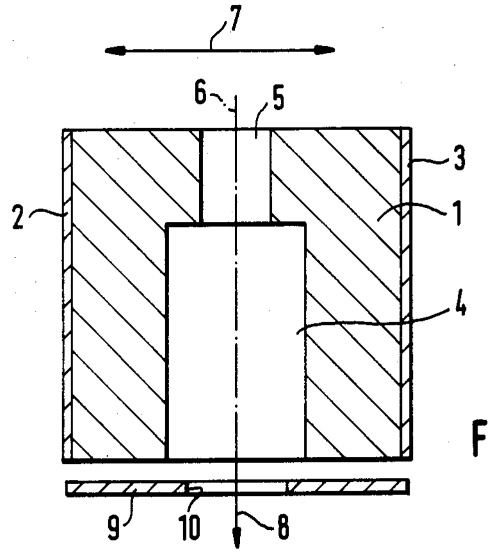
FIG. 1 is a first embodiment of the fuel-injection valve with a thickness vibrator, seen in longitudinal section, and of an attached diaphragm in rough diagrammatic showing.

In FIG. 1, a thickness vibrator of piezoelectric material is designated generally as 1. It is substantially of cubic shape and has electrodes 2 and 3 on two opposite sides.

Within the cube there is provided a fuel-receiving chamber 4 which passes at its upper side into a unilateral constriction 5. The unilateral constriction lies in a fuel feed path to the fuel-receiving chamber 4. The chamber and the unilateral constriction are developed with symmetry of revolution to a longitudinal axis 6, and they constitute a passage through the entire thickness vibrator.

When voltage is applied to the electrodes 2 and 3, the dimensions of the thickness vibrator change, inter alia as indicated by the direction of the arrow 7. Changes of volume in the fuel-receiving chamber 4 go hand in hand with this. As a result of the unilateral constriction 5, the fuel is sprayed in the preferred direction of movement 8 into the volume surrounding the thickness vibrator 1.

The size of droplet upon the atomization can be adjusted by an additional diaphragm 9 placed on the thickness vibrator, corresponding to the open cross-sectional area of a bore 10 in the diaphragm.

Figure 3:
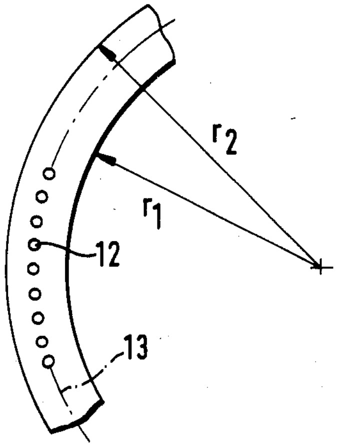
FIG. 3 is a plan view of a part of the radial vibrator of FIG. 2.
Figure 2:
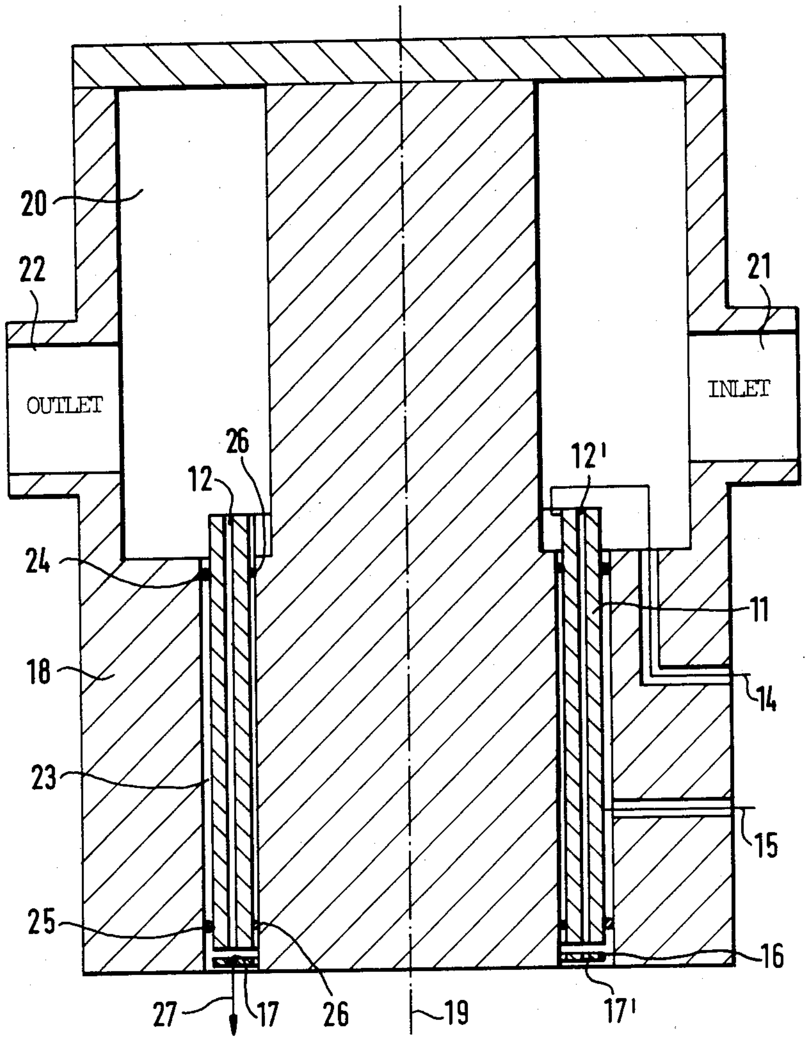
FIG. 2 is a second embodiment of a fuel-injection valve with a radial vibrator, seen in longitudinal section.

An essential part of a second embodiment of the fuel-injection valve shown in FIGS. 2 and 3 is a hollow cylindrical radial vibrator 11 of piezoelectric material. As can be noted from FIG. 3 in combination with FIG. 2, a number of fuel-receiving chambers 12, 12' are arranged in the hollow cylindrical radial vibrator between its inner wall having the radius $r_1$ and the outer wall having the radius $r_2$. The fuel-receiving chambers lie in the neutral arc 13 of the radial vibrator and are developed as continuous bores of constant diameter, i.e. open on top and on bottom. They extend parallel and concentric to the longitudinal axis 19.

The inner wall and the outer wall of the radial vibrator are each provided with an electrode, the electrodes being merely indicated by the feed lines 14 and 15 in FIG. 2.

Opposite the lower side of the fuel-receiving chambers 12, 12' there is an annular diaphragm 16 which has bores 17, 17' which determine the size of droplet and are aligned with the chambers 12, 12'.

The radial vibrator and the annular diaphragm are so mounted in a block 18 that the annular diaphragm 16 with the bores 17, 17' and the chambers of the radial vibrator 11 can spray fuel downward.

In the upper part of the rigid block, which is of rotational symmetry around the longitudinal axis 19 and preferably consists of metal, there is arranged the fuel feed path to the radial vibrator. The fuel feed path consists essentially of an annular constant-volume chamber 20 into which a fuel feed nipple 21 and a fuel discharge nipple 22 debouch. The free cross sections of the nipples 21 and 22 are small as compared with the area of the inner wall of the constant-volume chamber.

The radial vibrator 11, is inserted sealed by packings 24–26, in an annular recess 23 in the block 18.

Upon the application of high voltage to the feed lines 14, 15 and the electric field formed accordingly between the inner wall and the outer wall of the radial vibrator, a change in volume of the chambers 12, 12' in the annular vibrator takes place. The fuel flowing into these fuel-receiving chambers from the constant-volume chamber 20 is sprayed substantially downward through the bores 17,17' of the annular diaphragm 16 into the volume which surrounds the fuel-injection valve. The preferred direction of movement 27 of the fuel thus extends in the manner indicated by the arrow shown in the drawing. On the other hand, the fuel from the chambers 12, 12' cannot flow back, in any substantial amount, upward into the constant-volume chamber 20 since this chamber is filled with a large volume of substantially incompressible fuel. The fuel-receiving chambers 12, 12' can therefore be developed as a continuous bore, which is favorfable for manufacture.

The feed lines 14, 15 are conducted from the block 18 to a plug connection (not shown) via which a controlled electric voltage can thus be fed to the radial vibrator.

I claim:

1. An electrically actuatable fuel-injection throttle for internal combustion engines, comprising an injection opening;

a piezoelectric vibrator which is provided with electrodes and has at least one elongated fuel-receiving chamber, said vibrator being provided with a fuel feed path in fuel-conducting communication between said chamber and said injection opening; and wherein upon application of voltage to the electrodes the fuel is imparted a preferred movement through the chamber to the injection opening; said throttle further comprising a housing having a cylindrical wall; and wherein said piezoelectric vibrator is developed as a hollow, cylindrical radial vibrator within said wall, there being additional ones of said fuel-receiving chambers arranged parallel and concentric to the longitudinal axis of said housing.

2. A fuel injection valve according to claim 1 wherein an inner surface and an outer surface of said housing wall are responsive to a voltage applied substantially over the entirety of said inner and said outer surfaces so that all chamber volumes are changed simultaneously and in the same direction.

3. A fuel injection valve according to claim 1, wherein individual sections of said inner wall surface and said outer wall surface may be individually activated by voltage so that said chambers are activated individually.

4. A fuel injection valve according to claim 1 individual sections of said inner wall surface and said outer wall surface may be sequentially activated by voltage so that said chambers are activated sequentially.

5. A fuel injection valve according to claim 1, wherein several of said hollow cylindrical radial vibrators are arranged concentrically one within the other.

6. A fuel injection valve according to claim 1 wherein said radial vibrator is provided on its ejection side with an annular diaphragm having bores reduced in diameter as compared with diameters of the chambers.

7. A fuel injection valve according to claim 1 wherein said fuel-receiving chambers are arranged serially along said housing wall, said valve further comprising a common annular constant-volume chamber concentric to the longitudinal axis and formed from a block, one end of said radial vibrator extending into said constant-volume chamber.

8. An electrically actuatable fuel-injection throttle for internal combustion engines, comprising an injection opening;

a piezoelectric vibrator which is provided with electrodes and has at least one elongated fuel-receiving chamber, said vibrator being provided with a fuel feed path in fuel-conducting communication between said chamber and said injection opening; and wherein upon application of voltage to the electrodes the fuel is imparted a preferred movement through the chamber to the injection opening; wherein each fuel-receiving chamber is formed as a continuous bore of constant diameter in the vibrator; said valve further comprising a constant-volume chamber having a fuel feed opening an a fuel discharge opening, said constant-volume chamber being positioned at one end of the bore; and wherein the areas of said feed and said discharge openings are small as compared with the area of a wall of said constant-volume chamber.

* * * * *